(12) United States Patent
Fujimori

(10) Patent No.: US 7,255,967 B2
(45) Date of Patent: *Aug. 14, 2007

(54) IMAGE FORMING METHOD USED IN LIQUID CRYSTAL DISPLAY DEVICE FOR BOTH REFLECTION AND TRANSMISSION MODES

(75) Inventor: Junichi Fujimori, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 312 days.

This patent is subject to a terminal disclaimer.

(21) Appl. No.: 10/448,035

(22) Filed: May 30, 2003

(65) Prior Publication Data

US 2003/0224255 A1 Dec. 4, 2003

(30) Foreign Application Priority Data

Jun. 4, 2002 (JP) .............................. 2002-162384

(51) Int. Cl.
*G02F 1/1335* (2006.01)
*G02F 1/1339* (2006.01)
*G03F 7/00* (2006.01)

(52) U.S. Cl. ...................... 430/7; 430/273.1; 430/325; 349/106; 349/156

(58) Field of Classification Search ...................... None
See application file for complete search history.

(56) References Cited

U.S. PATENT DOCUMENTS 4,835,086 A * 5/1989 Jain ........................... 430/312
5,409,800 A * 4/1995 Sato et al. ................... 430/263
6,162,589 A * 12/2000 Chen et al. .................. 430/320
2001/0026347 A1* 10/2001 Sawasaki et al. ........... 349/156
2003/0162107 A1* 8/2003 Sato .............................. 430/7

FOREIGN PATENT DOCUMENTS

| JP | 59-175725 A | * 10/1984 |
|---|---|---|
| JP | 04-301846 A | 10/1992 |
| JP | 07-135170 A | 5/1995 |

OTHER PUBLICATIONS

"Notice of Reasons for Rejection" from JP 2002-049546, Jul. 2005, with English language translation.*

* cited by examiner

*Primary Examiner*—John A. McPherson
(74) *Attorney, Agent, or Firm*—Margaret A. Burke; Sheldon J. Moss

(57) ABSTRACT

The present invention provides an image forming method comprising the steps (1) to (5): (1) forming a first negative photosensitive resin layer on a substrate; (2) forming a barrier layer on the first negative photosensitive resin layer; (3) forming a second negative photosensitive resin layer on the barrier layer; (4) exposing the substrate, on which the first and second negative photosensitive resin layers are formed, to light via a photo mask having at least two types of light transmissible patterns; and (5) developing the exposed first and second negative photosensitive resin layers, wherein a photosensitivity ratio of the first negative photosensitive resin layer to the second negative photosensitive resin layer (the first/the second) is more than 1. The invention also provides a color filter, a spacer for a liquid crystal display device, and a projection for orientation control, each of which is formed by the method.

7 Claims, 2 Drawing Sheets

IMAGE FORMING METHOD USED IN LIQUID CRYSTAL DISPLAY DEVICE FOR BOTH REFLECTION AND TRANSMISSION MODES

CROSS-REFERENCE TO RELATED APPLICATIONS

This application claims benefit of and priority to Japanese Patent Application No. 2002-162384, filed on Jun. 4, 2002, which is incorporated herein by reference in its entirety for all purposes.

BACKGROUND OF THE INVENTION

1. Field of the Invention

The present invention relates to an image forming method, and a color filter, a spacer for a liquid crystal display device and a projection for orientation control formed thereby. More specifically, the invention relates to an image forming method used suitably for a liquid crystal display device for both reflection and transmission modes, and a color filter, a spacer for a liquid crystal display device and a projection for orientation control formed thereby.

2. Description of the Related Art

A color filter is used in a color face plate for a cathode-ray tube display, a photoelectric transducer for copying, a filter for a single tube system color television camera, a flat panel display using liquid crystal, a color solid state image sensor, and the like. Color filters are generally composed of regularly-arranged pixels of the three primary colors of blue, green and red. Color filters which include four or more hues are also produced as the need arises.

In recent years, in a field of liquid crystal display device (LCD), a reflection type liquid crystal display device has been developed as a portable terminal, a typical example of which is a portable telephone. However, the reflection type liquid crystal display device has a problem, in that a display quality thereof deteriorates indoors or in dark places. Thus, a liquid crystal display device for both reflection and transmission modes has been considered as an improvement measures.

An example of an embodiment of a structure of the liquid crystal display device for both reflection and transmission modes is illustrated in FIG. 3. In this embodiment, reflecting layers 12, which may be referred to as reflecting plates, are arranged at given intervals on a light transmissible substrate 10B. Transparent layers 16 are arranged at given intervals on a light transmissible substrate 10A. Pixels 14 are formed to cover a part of each of the transparent layers 16. The light transmissible substrate 10A and the light transmissible substrate 10B are arranged to be opposite to each other. Between the substrates is disposed a liquid crystal layer 18.

In the case of transmission display, the display is performed by transmitted light a from a backlight 20. In the case of reflection display, the display is attained by reflected light c resulting from external light b being transmitted through the light transmissible substrate 10A and reflected by the reflecting layer 12.

In this case, the thickness of the light-transmitted portion in the transmission section, though which the light is transmitted, is equal to the thickness of the light-transmitted portion of the reflection section, therefore, in a case in which sufficient brightness is realized in reflection display, the color purity of the transmission section is insufficient. Conversely, in a case in which the color purity of the transmission section is made sufficient, an inconvenience occurs, in which the refection section becomes dark. In order to solve such problems and improve display quality, making the thickness or the hue of the transmission section in a color filter different from that of the reflection section in the color filter has been attempted. However, since the process for producing such a color filter is complicated, costs for production thereof increase.

Further, in order to improve functions of an LCD panel, developments for increasing an angle of visiting or a contrast thereof have been made. As a result of the developments, use of a VA method using a vertical orientation mode and a formation of a photo spacer have been becoming mainstream. The mainstream manner requires a photolithographic step of forming the structure of the spacer and another photolithographic step of forming a projection structure for orientation control, which is essential for the VA method. Therefore, costs for the production of the LCD panel increase.

SUMMARY OF THE INVENTION

In order to solve the above-mentioned problems, the applicant of the present invention suggested a simple image-forming method used suitably for an LCD for reflection and transmission modes in which the film thickness of a colored layer in each pixel is partially changed, and a method of forming a spacer and a projection for orientation control simply. However, in this already-filed invention in which negative photosensitive resin layers having different photosensitivities are laminated on each other, the materials of the upper and lower photosensitive resin layers shift to each other when or after the photosensitive resin layers are applied or laminated. As a result, the photosensitivity difference therebetween becomes smaller than the initial photosensitivity difference. Thus, a problem that pattern-formation is hindered is caused. The invention provides an alternative for solving the above-mentioned problems. Namely, one aspect of the invention is an image forming method comprising the steps of:

(1) forming a first negative photosensitive resin layer on a substrate;

(2) forming a barrier layer on the first negative photosensitive resin layer;

(3) forming a second negative photosensitive resin layer on the barrier layer;

(4) exposing the substrate, on which the first and second negative photosensitive resin layers are formed, to light via a photo mask having at least two types of light transmissible patterns; and (5) developing the exposed first and second negative photosensitive resin layers, wherein a photosensitivity ratio of the first negative photosensitive resin layer to the second negative photosensitive resin layer (the first/the second) is more than 1.

The present invention further provides the image forming method, wherein the steps (1), (2) and (3) comprise use of a transfer sheet, which at least includes the first negative photosensitive resin layer, the barrier layer and the second negative photosensitive resin layer formed on a light transmissible support.

The present invention further provides the image forming method, wherein the step (1) comprises use of a transfer sheet, which at least includes a negative photosensitive resin layer formed on a light transmissible support, the step (2) comprises use of a transfer sheet, which at least includes a barrier layer formed on a light transmissible support; and the step (3) comprises use of a transfer sheet, which at least includes a negative photosensitive resin layer formed on a light transmissible support.

The present invention further provides the image forming method, wherein the steps (1) and (2) comprise use of a transfer sheet, which at least includes a negative photosensitive resin layer and a barrier layer formed on a light transmissible support; and the step (3) comprises a use of a transfer sheet, which at least comprises a negative photosensitive resin layer formed on a light transmissible support.

The present invention further provides the image forming method, wherein the step (1) comprises use of a transfer sheet, which at least includes a negative photosensitive resin layer formed on a light transmissible support formed on a light transmissible support; and the steps (2) and (3) comprise use of a transfer sheet, which at least includes a barrier layer and a negative photosensitive resin layer formed on a light transmissible support.

The present invention further provides the image forming method, wherein the transfer sheet includes a thermoplastic resin layer and an intermediate layer.

The present invention further provides the image forming method, wherein the steps (1) to (5) are performed at least twice.

The present invention further provides the image forming method, wherein the barrier layer comprises polyvinyl alcohol.

Further, as another aspect, the present invention provides a color filter for a liquid crystal display device which is formed by the image forming method.

Further, as still another aspect, the present invention provides a spacer for a liquid crystal display device and a projection for orientation control which is formed by the image forming method.

DETAILED DESCRIPTION OF THE INVENTION

Figure 1:
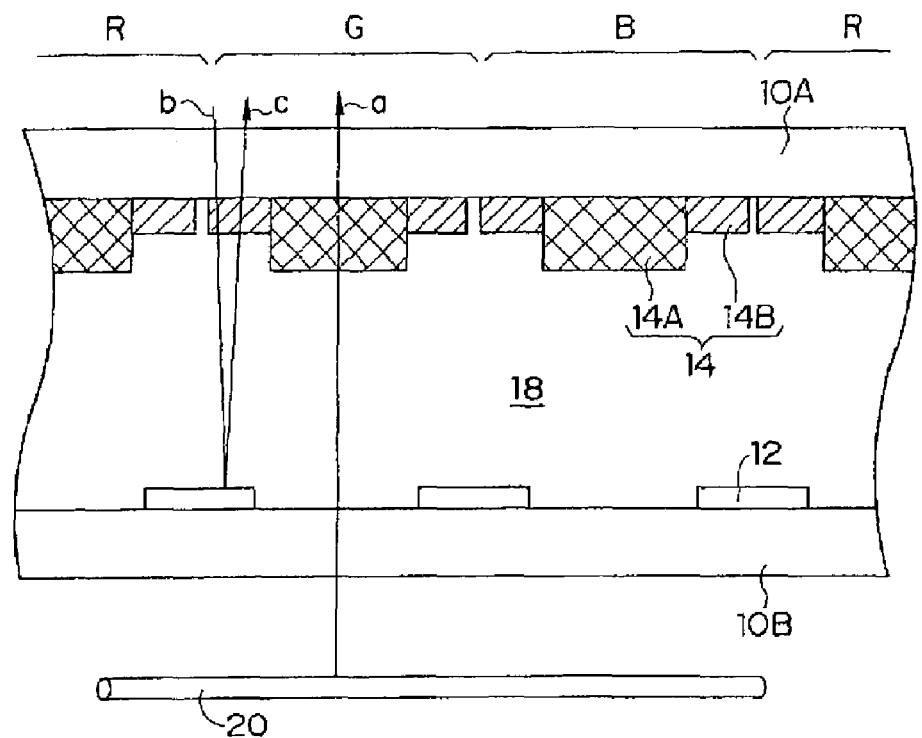
FIG. 1 is a view illustrating a structural example of the color filter of the present invention.

The image forming method of the present invention is an image forming method wherein a substrate on which a first negative photosensitive resin layer and a second negative photosensitive resin layer are formed is exposed to light through a photo mask having at least two light transmissible patterns and developed, the photosensitivity ratio of the first negative photosensitive resin layer to the second negative photosensitive resin layer (the first/the second) is more than 1, and a barrier layer is formed between the first negative photosensitive resin layer and the second negative photosensitive resin layer.

According to the invention, the substrate is pattern-exposed to light through the mask having at least two light transmissivities in a single pixel, whereby photosensitive resins having different film thicknesses can be laminated, in the single pixel, on the substrate by the single exposure. Furthermore, a liquid crystal display device for both reflection and transmission modes can be formed at a time, or a spacer and a projection for orientation control can be simultaneously formed. Moreover, in a photosensitive sheet wherein photosensitive resin layers having different photosensitivities are laminated, the materials of the photosensitive resin layers are prevented from shifting mutually between the layers, so that a good pattern can be formed.

The invention will be described in detail hereinafter.

Light transmissible substrate

The substrate used in the invention is preferably a light transmissible substrate which is transparent and has optical isotropy and sufficient heat resistance. Examples thereof include substrates made of polyethylene terephthalate, polybutylene terephthalate, polyethylene naphthalate, polystyrene, polycarbonate, polyether sulfone, cellulose acetate, polyarylate, soda glass, and borosilicate glass and quartz. If necessary, the surface of the light transmissible substrate may be subjected to undercoating treatment. Furthermore, the substrate may be subjected to such a treatment as glow discharge, corona discharge or ultraviolet ray (UV) radiation treatment.

The light transmissible substrate can be used in the form of a plate, sheet, film or the like. The thickness of the substrate may be appropriately set dependently on use and the material thereof. In general, the thickness is preferably from 0.01 to 10 mm. For example, in the case of a glass substrate, the thickness thereof preferably ranges from 0.3 to 3 mm.

In the case of reflection display according to an LCD panel for both reflection and transmission modes, there is used a light transmissible substrate in which a reflecting layer for reflecting incident outer light is formed and the reflecting layer is preferably made of Al, Mo, or the like. The thickness of the reflecting layer is preferably from about 100 to 10000 Å. The method for forming the reflecting layer is not particularly limited. For example, the layer can be formed by evaporation sputtering.

Negative Photosensitive Resin Layer

In the invention, the negative photosensitive resin layer (i.e., any one of the first and second negative photosensitive resin layers) preferably becomes soft or adhesive at 150° C. or less, and is preferably thermoplastic. Most of layers made of a known photopolymerizable composition have this nature. A part of the known layers can be further reformed by adding a thermoplastic bonder or adding a compatible plasticizer thereto.

As the material of the negative photosensitive resin layer in the invention, there can be used all known negative photosensitive resins, for example, negative photosensitive resins described in Japanese Patent Application Laid-Open (JP-A) No. 3-282404. Specific examples thereof include a photosensitive resin composed of a negative diazo resin and a binder, a photopolymerizable resin comprising a photopolymerizable monomer, a photopolymerization initiator and a binder, a photosensitive resin composition composed of an azide compound and a binder, and a cinnamic acid type photosensitive resin composition. Particularly preferred are photopolymerizable resins. As the photosensitive resin, a resin which can be developed with an aqueous alkali solution and a resin which can be developed with an organic solvent are known. The resin which can be developed with an aqueous alkali solution is preferred from the viewpoints of pollution prevention and labor safety.

In the invention, a photosensitivity difference is caused to be generated between the first photosensitive resin layer and the second photosensitive resin layer, whereby a pattern made of only the first layer and a pattern made of the first and second layers can be simultaneously formed by exposure to light through a gradation mask, which will be detailed later. In a case in which there is no photosensitive difference, an exposure value is adjusted in a transmissible portion and a half tone portion in the gradation mask exposure. From principle, however, only a pattern made of the laminated first and second layers is formed but no pattern made of only the first layer is formed since the materials have no sensitivity difference. Accordingly, in order to form a pattern made of only the first layer and a pattern made of the first and second layers simultaneously, the photosensitivity of the first photosensitive resin layer is made different from that of the second photosensitive resin layer, and the ratio of the photosensitivity of the first layer to that of the second layer is set to more than 1, preferably 2 or more.

In the invention, photosensitivity is defined as a minimum exposure value making it possible to give an image after a portion subjected to the exposure is developed. Specifically, the minimum exposure value is measured as follows.

(1) A photosensitive resin layer is applied onto a glass substrate and is dried to have a given film thickness. (2) A PVA as an oxygen blocking film or a barrier layer, which will be detailed later, is applied onto the dried photosensitive resin layer and dried to have a given film thickness. (3) The resultant is exposed to light through a step wedge mask (having optical densities increased stepwise by 0.15 from 0). (4) An alkali developing solution is used to develop the exposed film. (5) From the remaining film, the minimum number of the steps giving solids is read out. From the read minimum number, the minimum exposure value is calculated. The solids mean portions of the resin layer which is sufficiently hardened and remains to have the same film thickness (or the density) as the resin layer which has not yet been exposed to light. The minimum number of the steps giving solids means, when a photosensitive resin layer is stepwise exposed to light having intensity increased step by step through a step wedge mask, the minimum number of the optical steps which give solids.

The photosensitivity of the photosensitive resin varies dependently on the content of a pigment therein, the content of the photopolymerization initiator, and the amount of the monomer. In order to give a preferred photosensitivity difference between the first and second layers in the invention, the amount of the photopolymerization initiator in the first negative photosensitive resin layer to the amount of the photopolymerization initiator in the second negative photosensitive resin layer is preferably from 2:1 to 100:1.

Furthermore, one or more known dyes or pigments may be added to the photosensitive resin layer. All of the pigments are uniformly dispersed in the photosensitive resin layer. The particle size of the pigment is preferably 5 µm or less, more preferably 1 µm or less. For the production of a color filter, the particle size of the pigment is preferably 0.5 µm or less.

Preferred examples of the dye or pigment include Victoria Pure Blue BO (C.I. 42595), Auramine (C.I. 41000), Fat Black HB (C.I. 26150), Monolite Yellow GT (C.I. Pigment Yellow 12), Permanent Yellow GR (C.I. Pigment Yellow 17), Permanent Yellow HR (C.I. Pigment Yellow 83), Permanent Carmine FBB (C.I. Pigment Red 146), Foster Baum Red ESB (C.I. Pigment Violet 19), Permanent Ruby FBH (C.I. Pigment Red 11), Faster Pink B Supra (C.I. Pigment Red 81), Monastral Fast Blue (C.I. Pigment Blue 15), Monolite Fast Black B (C.I. Pigment Black 1), and carbon.

Examples of a pigment suitable for forming a color filter include C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60 and C.I. Pigment Blue 64.

Barrier layer

Between upper and lower photosensitive resin layers that are laminated, the materials of the photosensitive resin layers shift mutually. As a result, the photosensitivity difference between the upper and lower photosensitive resin layers becomes smaller than the initially-set difference so that the formation of patterns is hindered. In order to overcome this problem in the invention, a barrier layer is arranged between the first and second photosensitive resin layers.

In order to prevent the barrier layer from being mixed with the other layers when the barrier layer is applied or prevent the materials of the layers from diffusing between the layers, the material of the barrier layer is selected from materials soluble in water, alcohols, esters, aromatic solvents, aliphatic solvents or other solvents if the first and second photosensitive resin layers are soluble in organic ketone solvent. If the first and second photosensitive resin layers are soluble in aqueous solvent, the material of the barrier layer is selected from materials soluble in ketones, alcohols, esters, aromatic solvents, carbon chlorides, aliphatic solvents, or other solvents.

If the first and second photosensitive resin layers are soluble in ketone-, or ester-organic solvent, the material of the barrier layer is preferably a material soluble in water from the viewpoints of the prevention of the material shift, handling performance thereof, and environment protection. Examples of such a material include polyvinyl alcohol, polyvinyl alcohol derivatives, polyvinyl pyrrolidone, polyvinyl pyrrolidone derivatives, celluloses, polyvinyl ether/maleic anhydride polymers, water-soluble salts of carboxyalkylcellulose, water-soluble cellulose ethers, water-soluble salts of carboxyalkylstarch, various polyacrylamides, various water-soluble polyamides, water-soluble salts of polyacrylic acid, gelatin, ethylene oxide polymers, water-soluble salts of various starches or analogues thereof, copolymers of styrene and maleic acid, maleate resins, and combinations of two or more thereof. A combination of polyvinyl alcohol and polyvinyl pyrrolidone is particularly preferred.

The polyvinyl alcohol preferably has a capability of being cured in order to make the endurance of the barrier layer high. An example of such polyvinyl alcohol is a polyvinyl alcohol into which a styrylpyridium group is introduced. In a case in which polymers of polyvinyl alcohol and polyvinyl pyrrolidone are used together, the content of polyvinyl pyrrolidone is preferably from 1 to 75%, more preferably from 1 to 60%, and still more preferably from 10 to 50% by mass of the solid content in the barrier layer. If the content is within the range of 1 to 75% by mass, the adhesiveness between the photosensitive layer and the barrier layer is sufficient and the diffusion resistance of the materials does not deteriorate. The thickness of the barrier layer should be made very thin, and is preferably from about 0.05 to 5 µm, more preferably from 0.5 to 1 µm. If the thickness of the barrier layer is within the range of about 0.05 to 5 µm, the diffusion resistance of the barrier layer is sufficient and too much time is unnecessary for development or removal of the barrier layer.

The barrier layer may contain a plasticizer besides the above-mentioned materials in order to make the thermobonding ability thereof high. As the plasticizer, there is preferably used polyethylene glycol, a polyethylene glycol derivative, polypropylene glycol, a polypropylene glycol derivative, a polyethylene glycol/polypropylene glycol copolymer, or the like.

Transferring Material

As the transfer sheet in the invention, a transferring material described in JP-A No. 5-173320 can be preferably used. That is, in a transfer sheet in which a thermoplastic resin layer, an intermediate layer and a photosensitive resin layer are laminated, in this order, on a pre-support, the thermoplastic resin layer, which has a thickness of 1 μm or less, functions as a peeling layer, and the transfer sheet is transferred onto a substrate and subsequently the pre-support is peeled from the thermoplastic resin layer. In one aspect of the present invention, a light transmissible support can be used as the pre-support of the transfer sheet.

Transferring of the Transfer Sheet onto a Substrate

In the invention, the transferring of the photosensitive transfer sheet onto a substrate is attained by peeling a cover film of the photosensitive transfer sheet and then pressing and adhering the sheet onto the substrate under heating by means of an ordinarily-used laminator.

In a case in which the first photosensitive layer, the barrier layer and the second photosensitive layer are separately transferred by two or three operations, it is necessary that the thermoplastic resin layer is not transferred in the first transfer in the two-operation transfer or in the first and second transfers in the three-operation transfer. For this purpose, it is preferred to use a transfer sheet in which the thermoplastic resin layer surface of the pre-support is subjected to corona treatment, gelatin undercoating treatment or the like to improve the adhesiveness between the pre-support and the thermoplastic resin layer. The thermoplastic resin layer, of the transfer sheet, to be transferred at last may be transferred as it is since it is dissolved and removed at the time of development.

Photo Mask

In a case in which the photosensitive resin layer transferred onto the substrate is patterned, light is radiated onto the layer through a photo mask having a given pattern to perform pattern-exposure and subsequently the resultant is developed to yield a colored layer in a pattern form. The photo mask usually has a light completely-transmissible portion and a shading portion. The photo mask used in the invention is a gradation mask which further has at least one half tone portion. These portions are appropriately selected to match the photosensitivities of layers to be left after development, so as to form the photo mask. Specifically, the half tone portion is selected for the region where the only the first layer is to be left, the completely-transmissible portion is selected for the region where all the layers are to be left, and the shading portion is selected for the region where no layers are to be left.

Pattern-Exposure and Development

Using the above-mentioned photo mask, exposure can be performed by radiation of light having a wavelength of 300 to 500 nm. Examples of a light source which can be used include a high-pressure mercury lamp, a superhigh-pressure mercury lamp, a metal halide lamp and a Hg-Xe lamp.

After the exposure, development is performed to remove the thermoplastic resin layer, the intermediate layer and unnecessary portions (uncured portions) of the photosensitive resin layers.

A structural example of the color filter formed by the image forming method of the invention is illustrated in FIG. 1. About a transfer sheet wherein a first photosensitive resin layer having a high photosensitivity, a second photosensitive resin layer having a relatively lower photosensitivity and a barrier layer are adhered to each other, the half tone portion of the photo mask is used for a reflection mode liquid crystal display region of the sheet and the completely-transmissible portion of the photo mask is used for the transmission mode liquid crystal display region so as to perform exposure to light and development. In the portion where the half tone portion of the photo mask is used, only the first photosensitive resin layer remains as pixels 14B after the development. On the other hand, in the portion where the completely-transmissible portion of the photo mask is used, the first photosensitive resin layer, the barrier layer and the second photosensitive resin layer remain as pixels 14A after the development. As a result, the film thickness of the pixels 14A, where the first photosensitive resin layer, the barrier layer and the second photosensitive resin layer remain, is larger than that of the pixels 14B, where only the first photosensitive resin layer remains, by the film thickness of the second photosensitive resin layer plus the barrier layer. Thus, the pixels 14A, which are composed of the first photosensitive resin layer, the barrier layer and the second photosensitive resin layer, have a film thickness suitable for a transmission mode, and the pixels 14B, which are made of only the first photosensitive resin layer, have a film thickness suitable for a reflection mode.

As the developing solution, an inorganic developing solution and an organic developing solution are known. In a case in which a color filter is formed on a glass substrate, either one thereof can be used. However, in the case of a COA, that is, in a case in which a color filter is formed on a TFT active matrix substrate, it is preferred to use an organic alkali developing solution since Na and K ions in an inorganic alkali developing solution cause contamination.

The above-mentioned aqueous alkali solution is preferably an aqueous diluted solution of an alkali substance. A solution in which a small amount of an organic solvent miscible with water is added to the diluted solution may also be used. The concentration of the alkali substance in the aqueous alkali solution is preferably from 0.01 to 30% by mass, and the pH thereof is preferably from 8 to 14.

The above-mentioned organic alkali developing solution is preferably a developing solution containing an organic compound having a pKa of 7 to 13 at a concentration of 0.05 to 5 mole/L. A small amount of an organic solvent miscible with water may be added thereto. The pH of the developing solution is preferably from 8 to 13. Examples of the organic solvent miscible with water include methanol, ethanol, 2-propanol, 1-propanol, butanol, diacetone alcohol, ethylene glycol monomethyl ether, ethylene glycol monoethyl ether, ethylene glycol mono n-butyl ether, benzyl alcohol, acetone, methyl ethyl ketone, cyclohexane, ε-caprolactone, γ-butyrolactone, dimethylformamide, dimethylacetoamide, hexamethylphosphoryl amide, ethyl lactate, methyl lactate, ε-caprolactam, and N-methylpyrrolidone. The concentration of the organic solvent is preferably from 0.1 to 30% by mass.

Various known surfactants may be added to the aqueous alkali solution. The concentration of the surfactant(s) is preferably from 0.01 to 10% by mass.

The development can be performed by a known method, and a solvent or an aqueous developing solution, in particular, an aqueous alkali solution or the like is used, for example, (a) to immerse the exposed substrate itself in a developing bath or (b) to spray the exposed substrate with a spray or the like. If necessary, the substrate is developed while being rubbed with a rotary brush, a wet sponge or the like or while being irradiated with ultrasonic waves in order to make the solubility high.

In order to remove the soluble portion of the exposed photosensitive resin layer, a method of rubbing the layer with a rotary brush in the developing solution, a method of rubbing the layer with a wet sponge, and some other method can be combined The solution temperature of the developing solution is preferably from 20 to 40° C. It is preferred to perform a water washing step using distilled water, ion exchange water, ultra pure water or the like after the developing treatment. It is also preferred to bake the layer at a temperature of 200 to 260° C. after the developing treatment.

Formation of a Spacer and a Projection Structure

In a liquid crystal display element, a liquid crystal layer is generally sandwiched between two substrates, i.e., a filter side substrate comprising a color filter and a conductive layer (for example, a transparent pixel electrode) on the color filter; and an opposite substrate, with a conductive layer (for example, a transparent common electrode), arranged oppositely to the filter side substrate (a driving element such as a thin film transistor (TFT) or the like may be formed on any one of the filter side substrate and the opposite substrate).

According to the invention, a transparent photosensitive resin material is used to make it possible to form a spacer for a liquid crystal display device and a projection for liquid crystal orientation on a color filter in a single photolithographic step. The spacer is for keeping the thickness of the liquid crystal layer (cell gap) into a constant value (interval), and needs to be formed over the whole of the display area. The formation of the projection for liquid crystal orientation makes it possible to regulate the direction of the orientation of liquid crystal molecules and keep a wide field angle which does not depend on an observation position (angle) to the liquid crystal face. According to the invention, a spacer for liquid crystal display device and a projection for liquid crystal orientation can be simultaneously formed by the following method.

ITO is sputtered on a previously-formed color filter, and a cover film for a first transparent photosensitive transferring material is peeled. The photosensitive resin layer surface is brought into contact with the ITO surface to use a laminator to press and adhere the surface onto the ITO surface under heating. In this way, only the first transparent layer is transferred to the glass substrate. Furthermore, a cover film for a transparent photosensitive transferring material having a second layer and a barrier layer is peeled, and this transferring material is adhered to the first transparent layer surface so that the barrier layer surface contacts the first transparent layer surface. The pre-support and the thermoplastic resin layer are peeled from each other at the interface therebetween. The first transparent photosensitive resin layer, the barrier layer, the second transparent photosensitive resin layer, the intermediate layer and the thermoplastic resin layer are transferred onto the glass substrate. In this case, the photosensitivity of the first transparent photosensitive resin layer is different from that of the second transparent photosensitive resin layer, and the photosensitivity ratio of the first transparent photosensitive resin layer to the second transparent photosensitive resin layer (the photosensitivity of the first layer/the photosensitivity of the second layer) is more than 1, preferably 2 or more.

Next, the resultant is exposed to light through the above-mentioned gradation photo mask, and developed to remove the thermoplastic resin layer and the intermediate layer and remove unnecessary portions of the photosensitive resin layers, thereby forming a pattern made of only the first layer and a transparent pixel pattern made of the laminated first layer, second layer and barrier layer. Next, the resultant is baked at 200 to 260° C. for 20 to 150 minutes to form a spacer pattern and a projection for orientation control on the ITO simultaneously.

Figure 2:
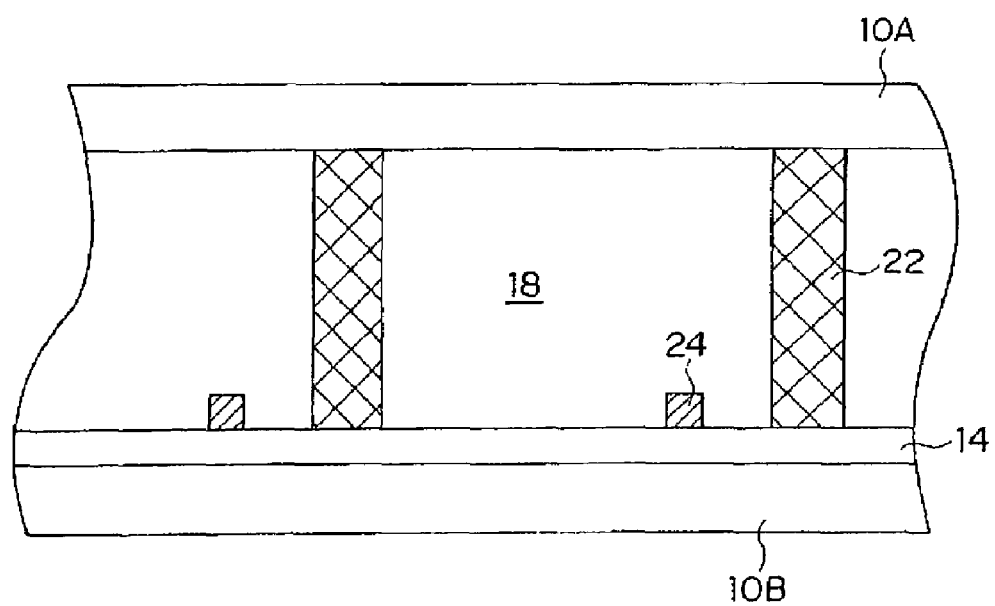
FIG. 2 is a view illustrating a structural example of the spacer and the projection for orientation control of the invention.
Figure 3:
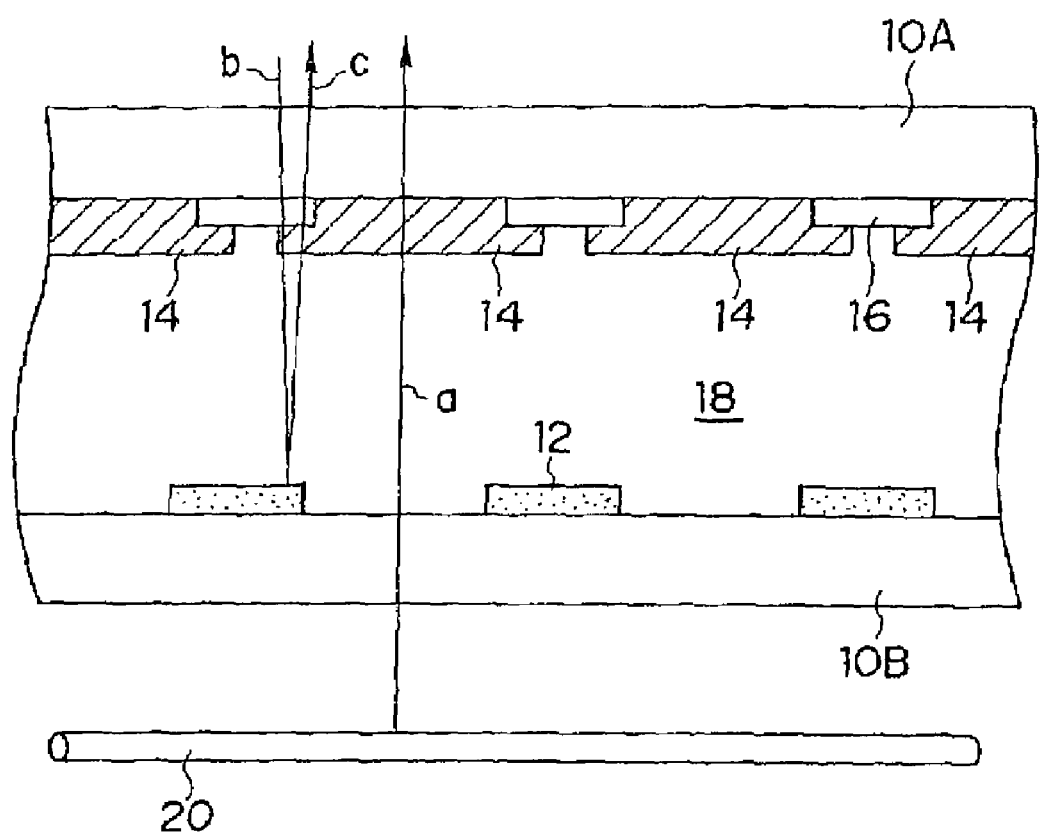
FIG. 3 is a view illustrating an example of an LCD panel for both reflection and transmission modes.

A structural example of the color filter formed by the image forming method of the invention is illustrated in FIG. 2. About a transfer sheet in which a first transparent photosensitive resin layer having a high photosensitivity, a barrier layer, and a second transparent photosensitive resin layer having a relatively lower photosensitivity are adhered to each other, the half tone portion of the photo mask is used for a region of a projection for orientation control and the completely-transmissible portion of the photo mask is used for a spacer region so as to perform exposure to light and development. In the portion where the half tone portion of the photo mask is used, only the first photosensitive resin layer remains as pixels 24B after the development. On the other hand, in the portion where the completely-transmissible portion of the photo mask is used, the first photosensitive resin layer, the barrier layer and the second photosensitive resin layer remain as pixels 22 after the development. As a result, the film thickness of the pixels 22, where the first photosensitive resin layer, the barrier layer and the second photosensitive resin layer remain, is larger. By setting the thickness of the transparent photosensitive resin layers to an arbitrary thickness, a thickness preferred for a spacer can be obtained. The pixels 24, where only the first photosensitive resin layer remains, are formed to have a film thickness suitable for the region of the projection for orientation control.

EXAMPLES

The invention will be more specifically described by way of the following examples. However, the invention is not limited by these examples.

Example 1

Formation of a Color Filter

A coating solution having the following formulation N1 is applied onto a gelatin layer surface of a polyethylene terephthalate film pre-support 75 μm in thickness, which was undercoated with a gelatin layer 0.2 μm in thickness, and then dried to form a thermoplastic resin layer having a dry film thickness of 20 μm.

Thermoplastic resin layer formulation N1:

| | |
|---|---|
| Methyl methacrylate/2-ethylhexyl acrylate/benzyl methacrylate/methacrylic acid copolymer (copolymer composition ratio (molar ratio) = 55/11.7/4.5/28.8) (weight average molecular weight = 90000) | 15 parts by weight |
| Polypropylene glycol diacrylate (average molecular weight = 822) | 6.5 parts by weight |
| Tetraethylene glycol dimethacrylate | 1.5 parts by weight |
| p-Toluene sulfonamide | 0.5 part by weight |
| Benzophenone | 1.0 part by weight |
| Methyl ethyl ketone | 30 parts by weight |

Next, a coating solution having the following formulation M1 was applied onto the above-mentioned thermoplastic resin layer, and then dried to form an intermediate layer having a dry film thickness of 1.6 μm.

Intermediate layer formulation M1:

| | |
|---|---|
| Polyvinyl alcohol (trade name: PVA205, manufactured by Kuraray Co., Ltd., saponification ratio = 80%) | 130 parts by weight |
| Polyvinyl pyrrolidone (trade name: K-90, manufactured by GRF Corporation) | 60 parts by weight |
| Fluorine-based surfactant (trade name: Surflone S-131, manufactured by Asahi Glass Co., Ltd.) | 10 parts by weight |
| Distilled water | 3350 parts by weight |

Three kinds photosensitive solutions for red (for an R1 layer), green (for a G1 layer) and blue (for a B1 layer), each of which had a formulation shown in Table 1, were applied onto four pre-supports, each of which had the thermoplastic resin layer and the intermediate layer, and then dried to form three kinds of colored photosensitive resin layers having a film thickness of 1.2 μm.

TABLE 1

| | R1 | G1 | B1 |
|---|---|---|---|
| Benzyl methacrylate/methacrylic acid copolymer (molar ratio = 73/27, molecular weight: 30000) | 7.8 | 10.2 | 9.8 |
| Dipentaerythritol hexaacrylate | 5.2 | 4.6 | 6.1 |
| Fluorine-based surfactant (trade name: Megaface F176, manufactured by Dainippon Ink & Chemicals, Inc.) | 0.06 | 0.14 | 0.12 |
| 7-[2-[4-(3-Hydroxymethyl piperidino)-6-diethylamino]triazylamino]-3-phenylcoumalin | 1.49 | 1.26 | 0.25 |
| 2-Trichloromethyl-5-(p-styrylstyryl)-1,3,4-oxadiazole | 0.32 | 0.22 | 0.23 |
| Phenothiazine | 0.012 | 0.006 | 0.025 |
| C.I.PR 254 dispersed solution (trade name: RT-107, manufactured by Fujifilm Olin Co., Ltd.) | 8.6 | 0 | 0 |
| C.I.PG36 dispersed solution trade name: GT-2, manufactured by Fujifilm Olin Co., Ltd. | 0 | 5.6 | 0 |
| C.I.PY 138 dispersed solution (trade name: YT-123, manufactured by Fujifilm Olin Co., Ltd.) | 0 | 3.9 | 0 |
| C.I.B 15:6 dispersed solution (trade name: MHI Blue 7075M, manufactured by Mikuni Color K.K.) | 0 | 0 | 1.32 |
| Propylene glycol monomethyl ether acetate | 27 | 26 | 14 |
| Methy ethyl ketone | 35 | 34 | 44 |

Furthermore, a cover film made of polypropylene (thickness: 12 μm) was bonded to each of the photosensitive resin layers under pressure, so as to produce a red (R1), blue (B1) or green (G1) photosensitive transferring material.

Next, a coating solution having the same formulation N1 as described above was applied onto a PET surface of a polyethylene terephthalate film pre-support 75 μm in thickness, and then dried to form a thermoplastic resin layer having a dry film thickness of 20 μm.

Next, a coating solution having the same formulation M1 as described above was applied onto the above-mentioned thermoplastic resin layer, and then dried to form an intermediate layer having a dry film thickness of 1.6 μm.

Three kinds photosensitive solutions for red (for an R2 layer), green (for a G2 layer) and blue (for a B2 layer), each of which had a formulation shown in Table 2, were applied onto the intermediate layer, and then dried to form three kinds of colored photosensitive resin layers having a film thickness of 1.2 μm.

TABLE 2

| | R2 | G2 | B2 |
|---|---|---|---|
| Benzyl methacrylate/methacrylic acid copolymer (molar ratio = 73/27, molecular weight: 30000) | 7.8 | 10.2 | 9.8 |
| Dipentaerythritol hexaacrylate | 5.2 | 4.6 | 6.1 |
| Fluorine-based surfactant (trade name: Megaface F176, manufactured by Dainippon Ink & Chemicals, Inc.) | 0.06 | 0.14 | 0.12 |
| 7-[2-[4-(3-Hydroxymethyl piperidino)-6-diethylamino]triazylamino]-3-phenylcoumalin | 1.49 | 1.26 | 0.25 |
| 2-Trichloromethyl-5-(p-styrylstyryl)-1,3,4-oxadiazole | 0.16 | 0.11 | 0.12 |
| Phenothiazine | 0.012 | 0.006 | 0.025 |
| C.I.PR 254 dispersed solution (trade name: RT-107, manufactured by Fujifilm Olin Co., Ltd.) | 19.2 | 0 | 0 |
| C.I.PG36 dispersed solution (trade name: GT-2, manufactured by Fujifilm Olin Co., Ltd.) | 0 | 11.3 | 0 |
| C.I.PY 138 dispersed solution (trade name: YT-123, manufactured by Fujifilm Olin Co., Ltd.) | 0 | 7.8 | 0 |
| C.I.B 15:6 dispersed solution (trade name: MHI Blue 7075M, manufactured by Mikuni Color K.K.) | 0 | 0 | 26.4 |
| Propylene glycol monomethyl ether acetate | 27 | 26 | 14 |
| Methyl ethyl ketone | 35 | 34 | 44 |

A coating solution having the following formulation O1 was applied onto the above-mentioned photosensitive resin layers, and then dried to form a barrier layer having a dry film thickness of 1 μm.

Barrier layer formulation O1:

| | |
|---|---|
| Polyvinyl alcohol (trade name: PVA205, manufactured by Kuraray Co., Ltd., saponification ratio = 80%) | 130 parts by weight |
| Polyvinyl pyrrolidone (trade name: K-90, manufactured by GRF Corporation) | 60 parts by weight |
| Fluorine-based surfactant (trade name: Surflone S-131, manufactured by Asahi Glass Co., Ltd.) and | 10 parts by weight, |
| Distilled water | 3350 parts by weight |

These photosensitive transferring materials were used to produce a color filter by the following method. The cover film of the R1 red photosensitive transferring material was peeled, and a laminator (trade name: VP-II, manufactured by Taisei-laminator K. K.) was used to press and adhere the photosensitive resin layer surface (pressure: 0.8 kg/cm$^2$) onto a transparent glass substrate (thickness: 1.1 mm) under heating (130° C.). Subsequently, the intermediate layer and the colored photosensitive layer were peeled from each other at the interface therebetween, so as to transfer only the R1 red colored layer onto the glass substrate. Furthermore, the R1 red colored layer was adhered onto the R2 barrier layer surface so that R1 red colored layer surface contacted the R2 barrier layer surface. The pre-support and the thermoplastic resin layer were peeled from each other at the interface therebetween to transfer the R1 red photosensitive resin layer, the barrier layer, the R2 red photosensitive resin layer, the intermediate layer and the thermoplastic resin layer onto the glass substrate.

Next, the resultant was exposed to light through a given chromium photo mask (two-gradation mask: the optical density of the first area to the optical density of the second area=1/0.1), and then the thermoplastic resin layer and the intermediate layer were removed with a developing solution (trade name: PD2, manufactured by Fuji Photo Film Co., Ltd.) At this time, the photosensitive resin layers were not substantially developed. Next, the photosensitive resin layers were developed with a developing solution (trade name: CD1, manufactured by Fuji Photo Film Co., Ltd.) to remove unnecessary portions. A developing solution (trade name: SD1, manufactured by Fuji Photo Film Co., Ltd.) was used to conduct finishing treatment (brush treatment), so as to form a pattern made of only the R1 layer and a red pixel pattern made of the laminated R1 layer, barrier layer and R2 layer on the glass substrate. Next, in the same manner as above, the G1 and G2 green photosensitive transferring materials were adhered to the glass substrate on which the red pixel patterns are formed, and then peeling, exposure to light and development were performed to form a green pixel pattern made of only the G1 and a green pixel pattern made of the laminated G1 layer, barrier layer and G2 layer. The B1 and B2 blue photosensitive transferring materials were used to perform (repeat) substantially the same steps to form a color filter on the transparent glass substrate.

Example 2

(Formation of a Color Filter)

A coating solution having the above-mentioned formulation N1 was applied onto a polyethylene terephthalate film pre-support 75 μm in thickness, and then dried to form a thermoplastic resin layer having a dry film thickness of 20 μm.

Next, a coating solution having the above-mentioned formulation M1 was applied onto the above-mentioned thermoplastic resin layer, and then dried to form an intermediate layer having a dry film thickness of 1.6 μm.

Three kinds photosensitive solutions for red (for an R2 layer), green (for a G2 layer) and blue (for a B2 layer), each of which had a formulation shown in Table 2, were applied onto four pre-supports, each of which had the thermoplastic resin layer and the intermediate layer, and then dried to form three kinds of colored photosensitive resin layers having a film thickness of 1.2 μm.

A coating solution having the above-mentioned formulation O1 was applied onto the above-mentioned photosensitive resin layer, and then dried to form a barrier layer having a dry film thickness of 1 μm.

Three kinds of photosensitive solutions for red (for an R1 layer), green (for a G1 layer) and blue (for a B1 layer), each of which had a formulation shown in Table 1, were applied onto the above-mentioned barrier layer, and then dried to form three kinds of cored photosensitive resin layers 1.2 μm in thickness.

Furthermore, a cover film made of polypropylene (thickness: 12 μm) was bonded to each of the colored photosensitive resin layers under pressure, so as to produce finally red, blue and green photosensitive transferring materials having the thermoplastic resin layer, the intermediate layer, the colored photosensitive resin layer, the barrier layer and the colored photosensitive resin layer.

These photosensitive transferring materials were used to produce a color filter by the following method. The cover film of the red photosensitive transferring material was peeled, and a laminator (trade name: VP-II, manufactured by Taisei-laminator K.K.) was used to press and adhere the photosensitive resin layer surface (pressure: 0.8 kg/cm$^2$) onto a transparent glass substrate (thickness: 1.1 mm) under heating (130° C.). Subsequently, the intermediate layer and the colored photosensitive layer were peeled from each other at the interface therebetween, so as to transfer the R1 red colored layer, the barrier layer, the R2 red photosensitive resin layer, the intermediate layer and the thermoplastic resin layer successively on the glass substrate.

Next, the resultant was exposed to light through a given chromium photo mask (two-gradation mask: the optical density of the first area to the optical density of the second area=1/0.1), and then the thermoplastic resin layer and the intermediate layer were removed with a developing solution (trade name: PD2, manufactured by Fuji Photo Film Co., Ltd.). At this time, the photosensitive resin layers were not substantially developed. Next, the photosensitive resin layers were developed with a developing solution (trade name: CD1, manufactured by Fuji Photo Film Co., Ltd.) to remove unnecessary portions. A developing solution (trade name: SD1, manufactured by Fuji Photo Film Co., Ltd.) was used to conduct finishing treatment (brush treatment), so as to form a pattern made of only the R1 layer and a red pixel pattern made of the laminated R1 layer, barrier layer and R2 layer on the glass substrate. Next, in the same manner as above, the G1 and G2 green photosensitive transferring materials were adhered to the glass substrate on which the red pixel patterns were formed, and then peeling, exposure to light and development were performed to form a green pixel pattern made of only the G1 layer and a green pixel pattern made of the laminated G1 layer, barrier layer and G2 layer. The B1 and B2 blue photosensitive transferring materials were used to perform substantially the same steps to form a color filter on the transparent glass substrate.

Example 3

(Formation of a Spacer and a Projection for Orientation Control)

A coating solution having the above-mentioned formulation N1 was applied onto a polyethylene terephthalate film pre-support 75 μm in thickness, and then dried to form a thermoplastic resin layer having a dry film thickness of 20 μm.

Next, a coating solution having the above-mentioned formulation M1 was applied onto the above-mentioned thermoplastic resin layer, and then dried to form an intermediate layer having a dry film thickness of 1.6 μm.

A photosensitive solution for transparent color (for P1 layer), having a formulation shown in Table 3, was applied onto the pre-support in which the above-mentioned thermoplastic resin layer and intermediate layer were formed, and then dried to form a P1 transparent photosensitive resin layer 1.2 μm in thickness.

TABLE 3

| | P1 |
|---|---|
| Benzyl methacrylate/methacrylic acid copolymer (molar ratio = 73/27, molecular weight: 30000) | 7.8 |
| Dipentaerythritol hexaacrylate | 5.2 |
| Fluorine-based surfactant (trade name: Megaface F176, manufactured by Dainippon Ink & Chemicals, Inc.) | 0.06 |
| Photopolymerization initiator (trade name: Irgacure 651, manufactured by Ciba-Geigy) | 0.32 |
| Phenothiazine | 0.012 |

TABLE 3-continued

|  | P1 |
|---|---|
| Propylene glycol monomethyl ether acetate | 27 |
| Methyl ethyl ketone | 35 |

A coating solution having the above-mentioned formulation O1 was applied onto the above-mentioned photosensitive resin layer, and then dried to form a barrier layer having a dry film thickness of 0.5 μm.

A photosensitive solution for transparent color (for A1 layer), having a formulation shown in Table 4, was applied onto the above-mentioned barrier layer, and then dried to form a transparent photosensitive resin layer 1.2 μm in thickness.

TABLE 4

|  | A1 |
|---|---|
| Benzyl methacrylate/methacrylic acid copolymer (molar ratio = 73/27, molecular weight: 30000) | 7.8 |
| Dipentaerythritol hexaacrylate | 5.2 |
| Fluorine-based surfactant (trade name: Megaface F176, manufactured by Dainippon Ink & Chemicals, Inc.) | 0.06 |
| 2-Trichloromethyl-5-(p-styrylstyryl)-1,3,4-oxadiazole | 0.32 |
| Phenothiazine | 0.012 |
| Propylene glycol monomethyl ether acetate | 27 |
| Methyl ethyl ketone | 35 |

Furthermore, a cover film made of polypropylene (thickness: 12 μm) was bonded onto the above-mentioned photosensitive resin layer under pressure to produce a transparent (P1) photosensitive transferring material.

The photosensitive transferring material was used to produce a spacer and a projection for orientation control on a color filter by the following method. ITO was sputtered onto a previously-formed color filter (substrate: glass (thickness: 0.7 mm)) to have a resistance of 20Ω/□. The cover film of the transparent photosensitive transferring material was peeled. A laminator (trade name: VP-II, manufactured by Taisei-laminator K.K.) was used to bring the photosensitive resin layer surface into contact with the ITO surface to press and adhere the resin layer surface (pressure: 0.8 kg/cm$^2$) onto the ITO surface under heating (130° C.). The pre-support and the thermoplastic resin layer were peeled from each other at the interface therebetween, so as to transfer the A1 transparent photosensitive resin layer, the barrier layer, the P1 transparent photosensitive resin layer, the intermediate layer and the thermoplastic resin layer successively on the glass substrate.

Next, the resultant was exposed to light through a given chromium photo mask (two-gradation mask: the optical density of the first area to the optical density of the second area=1/0.1), and then the thermoplastic resin layer and the intermediate layer were removed with a developing solution (trade name: PD2, manufactured by Fuji Photo Film Co., Ltd.). At this time, the photosensitive resin layers were not substantially developed. Next, the photosensitive resin layers were developed with a developing solution (trade name: CD1, manufactured by Fuji Photo Film Co., Ltd.) to remove unnecessary portions. A developing solution (trade name: SD1, manufactured by Fuji Photo Film Co., Ltd.) was used to conduct finishing treatment (brush treatment), so as to form a pattern made of only the A1 layer and a transparent pixel pattern made of the laminated A1 layer and P1 layer on the glass substrate. Next, the resultant was baked at 240° C. for 50 minutes to form a spacer pattern having a height of 3.7 μm and a projection for orientation control having a thickness of 1.0 μm on the ITO.

Example 4

(Formation of a Spacer and a Projection for Orientation Control)

A transparent photosensitive material was produced in the same manner as in Example 3 except that no thermoplastic resin layer was formed on the pre-support. This was subjected to the same steps as in Example 3 so as to form a spacer pattern having a height of 3.7 μm and a projection for orientation control having a thickness of 1.0 μm on the ITO.

Comparative Example 1

A photosensitive material was formed in the same manner as in Example 1 except that no barrier layer was formed when the photosensitive material having the second photosensitive layer is formed.

This was used to try to perform the same steps as in Example 1 to form a color filter. However, a part of the second layer remained in a region where only the first photosensitive layer (R1, G1 and B1) was to remain.

Comparative Example 2

A photosensitive material was formed in the same manner as in Example 2 except that no barrier layer is formed. However, when the second photosensitive layer was applied, a part of the first photosensitive layer was dissolved so that the surface became rough.

This was used to try to perform the same steps as in Example 2 to form a color filter. However, almost all of the second layer remained in a region where only the first photosensitive layer (R1, G1 and B1) was to remain.

Comparative Example 3

A photosensitive material was formed in the same manner as in Example 3 except that no barrier layer is formed. However, when the second transparent photosensitive layer was applied, a part of the first photosensitive layer was dissolved so that the surface became rough.

This was used to perform the same steps as in Example 3 to form a spacer pattern having a height of 3.7 μm and a projection for orientation control having a thickness of 1.0 μm on the ITO. However, almost all of the P1 layer remained in a region where only the A1 layer was to remain.

Comparative Example 4

A photosensitive material was formed in the same manner as in Example 4 except that no barrier layer was formed. However, when the second transparent photosensitive layer was applied, a part of the first photosensitive layer was dissolved so that the surface became rough.

This was used to perform the same steps as in Example 4 to form a spacer pattern having a height of 3.7 μm and a projection for orientation control having a thickness of 1.0 μm on the ITO. However, almost all of the P1 layer remained in a region where only the A1 layer was to remain.

According to the invention, pattern-exposure to light was performed through a mask having at least two light transmissivities in a single pixel, whereby photosensitive resins having different film thicknesses could be laminated on the single pixel by the single exposure. Furthermore, a liquid crystal display device for both reflection and transmission modes could be formed at a time, or a spacer and a projection for orientation control could be simultaneously formed. Moreover, in a photosensitive sheet in which photosensitive resin layers having different photosensitivities were laminated, the materials of the photosensitive resin layers were prevented from shifting mutually between the layers, so that a good pattern could be formed.

What is claimed is:

1. An image forming method comprising:
   (1) forming a first negative photosensitive resin layer on a substrate;
   (2) forming a barrier layer on the first negative photosensitive resin layer;
   (3) forming a second negative photosensitive resin layer on the barrier layer;
   (4) exposing the substrate, on which the first and second negative photosensitive resin layers are formed, to light via a photo mask having at least two types of light transmissible patterns; and
   (5) developing the exposed first and second negative photosensitive resin layers, wherein a photosensitivity ratio of the first negative photosensitive resin layer to the second negative photosensitive resin layer (the first/the second) is more than 1 and wherein the image forming method further satisfies at least one of the following (i) to (iv):
   (i): (1), (2) and (3) comprise use of a transfer sheet, which at least includes the first negative photosensitive resin layer, the barrier layer and the second negative photosensitive resin layer formed on a light transmissible support;
   (ii): (1) comprises use of a transfer sheet, which at least includes a negative photosensitive resin layer formed on a light transmissible support, the (2) comprises use of a transfer sheet, which at least includes a barrier layer formed on a light transmissible support; and (3) comprises use of a transfer sheet, which at least includes a negative photosensitive resin layer formed on a light transmissible support;
   (iii): (1) and (2) comprise use of a transfer sheet, which at least includes a negative photosensitive resin layer and a barrier layer formed on a light transmissible support; and (3) comprises a use of a transfer sheet, which at least comprises a negative photosensitive resin layer formed on a light transmissible support;
   (iv): (1) comprises use of a transfer sheet, which at least includes a negative photosensitive resin layer formed on a light transmissible support; and (2) and (3) comprise use of a transfer sheet, which at least includes a barrier layer and a negative photosensitive resin layer formed on a light transmissible support.

2. An image forming method according to claim 1, wherein the transfer sheet includes a thermoplastic resin layer and an intermediate layer.

3. A color filter for use with a liquid crystal display device formed by the process of claim 1.

4. A spacer for a liquid crystal display device and a projection for orientation control formed by the process of claim 1.

5. An image forming method comprising:
   (1) forming a first negative photosensitive resin layer on a substrate;
   (2) forming a barrier layer on the first negative photosensitive resin layer;
   (3) forming a second negative photosensitive resin layer on the barrier layer;
   (4) exposing the substrate, on which the first and second negative photosensitive resin layers are formed, to light via a photo mask having at least two types of light transmissible patterns; and
   (5) developing the exposed first and second negative photosensitive resin layers, wherein a photosensitivity ratio of the first negative photosensitive resin layer to the second negative photosensitive resin layer (the first/the second) is more than 1; wherein (1) to (5) are performed at least twice.

6. A color filter for a liquid crystal display device formed by the process of claim 5.

7. A spacer for a liquid crystal display device and a projection for orientation control formed by the process of claim 5.

* * * * *